(12) United States Patent
Ice

(10) Patent No.: US 7,457,134 B2
(45) Date of Patent: Nov. 25, 2008

(54) ELECTROMAGNETIC RADIATION CONTAINMENT SYSTEM

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/639,211

(22) Filed: Aug. 12, 2003

(65) Prior Publication Data

US 2004/0032715 A1 Feb. 19, 2004

Related U.S. Application Data

(60) Provisional application No. 60/403,322, filed on Aug. 13, 2002, provisional application No. 60/422,539, filed on Oct. 31, 2002.

(51) Int. Cl.
*H05K 9/00* (2006.01)

(52) U.S. Cl. .................. 361/816; 361/818; 361/800

(58) Field of Classification Search ............... 361/818, 361/816, 800, 799, 686, 730, 756, 727, 760, 361/748, 720, 752, 797, 737, 790; 174/35 R, 174/51, 250, 35; 257/96; 348/836; 455/347; 439/377; 211/41.17
See application file for complete search history.

(56) References Cited

U.S. PATENT DOCUMENTS

| | | | |
|---|---|---|---|
| 3,343,581 A | | 9/1967 | Martin et al. |
| 5,083,239 A | * | 1/1992 | Sedlemeier et al. ......... 361/816 |
| 5,090,117 A | * | 2/1992 | Dickie .......................... 29/840 |
| 5,175,669 A | | 12/1992 | Navia et al. |
| 5,216,578 A | | 6/1993 | Zenitani et al. |
| 5,654,873 A | | 8/1997 | Smithson et al. |
| 5,721,669 A | | 2/1998 | Becker et al. |
| 5,746,326 A | * | 5/1998 | Hong ....................... 211/41.17 |
| 5,761,033 A | | 6/1998 | Wilhelm |
| 5,812,377 A | | 9/1998 | Golbach |
| 6,008,995 A | | 12/1999 | Pusateri et al. |
| 6,043,991 A | * | 3/2000 | Sorrentino .................. 361/816 |
| 6,198,633 B1 | | 3/2001 | Lehman et al. |
| 6,293,636 B1 | | 9/2001 | Le et al. |
| 6,309,237 B1 | | 10/2001 | Longueville |
| 6,385,053 B1 | | 5/2002 | Parizi et al. |
| 6,466,449 B1 | | 10/2002 | Sheen et al. |
| 6,483,024 B1 | * | 11/2002 | Smithson et al. ........ 174/35 GC |

(Continued)

OTHER PUBLICATIONS

U.S. Appl. No. 10/639,064, filed Aug. 12, 2003, Ice.

(Continued)

*Primary Examiner*—Hung S Bui
(74) *Attorney, Agent, or Firm*—Workman Nydegger

(57) ABSTRACT

An electromagnetic radiation containment system is provided for use in connection with functional modules and an associated card cage disposed in the chassis of an electronic equipment enclosure. The electromagnetic radiation containment system includes conductive elements uniformly distributed about the perimeter of a functional module configured to be received within the card cage, and further includes grounding elements in electrical communication with the chassis so that when the functional module is positioned within a slot of the card cage, at least some of the conductive elements are in electrical communication with the grounding elements. The uniform distribution of the conductive elements on the functional module(s) enables the functional modules to be arranged above and below each other, as well as side by side, without compromising the electromagnetic radiation containment functionality that is afforded when each of the slots of the card cage is occupied.

22 Claims, 8 Drawing Sheets

U.S. PATENT DOCUMENTS

| | | | |
|---|---|---|---|
| 6,542,383 B1 * | 4/2003 | Tsuyuki et al. | 361/816 |
| 6,580,616 B2 | 6/2003 | Greenside et al. | |
| 6,661,651 B1 * | 12/2003 | Tanzer et al. | 361/685 |
| 6,661,673 B2 | 12/2003 | Brooks et al. | |
| 6,865,092 B2 | 3/2005 | Joist et al. | |
| 6,940,731 B2 | 9/2005 | Davis et al. | |
| 7,042,737 B1 * | 5/2006 | Woolsey et al. | 361/799 |
| 2003/0231480 A1 | 12/2003 | Mair et al. | |

OTHER PUBLICATIONS

U.S. Appl. No. 10/638,982, filed Aug. 12, 2003, Ice.
U.S. Appl. No. 10/638,981, filed Aug. 12, 2003, Ice.
U.S. Appl. No. 10/722,924, filed Feb. 5, 2004, Ice.

* cited by examiner

ELECTROMAGNETIC RADIATION CONTAINMENT SYSTEM

CROSS-REFERENCE TO RELATED APPLICATIONS

This application claims the benefit of U.S. Provisional Patent Application Nos. 60/403,322, entitled PLUG-IN MODULE WITH EMI CONTROL FEATURE and filed on Aug. 13, 2002, and 60/422,539, entitled FUNCTIONAL MODULE WITH EMI CONTROL FEATURE and filed on Oct. 31, 2002, both of which are incorporated herein in their respective entireties by this reference.

Further, this application hereby incorporates, in their respective entireties, the following United States Patent Applications filed the same day herewith: U.S. patent application Ser. No. 10/638,981, entitled CARD CAGE SYSTEM; U.S. patent application Ser. No. 10/639,064, entitled ADAPTER ELEMENT FOR LARD CAGE SYSTEM; and, U.S. patent application Ser. No. 10/638,982, entitled FUNCTIONAL MODULE WITH CARD GUIDE ENGAGEMENT FEATURE.

BACKGROUND

1. Technological Field

This invention is generally concerned with the control of electromagnetic interference and related problems associated with the operation of functional modules in electronic equipment enclosures. More particularly, embodiments of the invention relate to an electromagnetic radiation containment system that includes features directed to the containment and control of electromagnetic radiation associated with the operation of one or more functional modules arranged in an electrical equipment enclosure, and thereby contributes to a relative decrease in the EMI that may otherwise result from such operation.

2. Related Technology

Electronic equipment enclosures are used in a variety of different industries and applications and generally serve to receive one or more pieces of electronic equipment and devices in such a way that the pieces of electronic equipment can operably interact with each other and/or with the electronic equipment enclosure. In particular, such electronic equipment enclosures typically include features directed to permitting the use of one or more "plug-in" functional modules that electrically and mechanically interface with the electronic equipment enclosure and/or with other functional modules, and that can be removed and/or replaced as desired.

To this end, many electronic equipment enclosures include internal structures configured to removably receive one or more functional modules in a desired arrangement. Such internal structures are often referred to as "card cages." The card cage is configured so as to allow a user to modify the functionality associated with the electronic equipment enclosure by selecting particular functional modules to be employed in the electronic equipment enclosure. Specifically, the functionality associated with a particular electronic equipment enclosure can be modified by adding and/or removing selected functional modules having desired functional aspects to/from the card cage. In this regard, many electronic equipment enclosures are configured so that they need not be fully occupied with functional modules in order for the functional modules to be operable. Rather, as few as one functional module can be operably employed in such electronic equipment enclosure configurations.

As suggested earlier, the functionality of any particular functional module or group of functional modules may vary widely according to the demands of a particular application. While their respective functionalities may differ however, many of such functional modules nonetheless share a number of similar structural features.

For example, typical functional modules employed in conjunction with card cages include a printed circuit board, or "card," attached to a front panel that may include various indicators, readouts, and/or connectors. Circuitry disposed on the card communicates with such indicators, readouts and connectors and serves to implement the functionality associated with that particular functional module. Various connectors on the rear of the card permit communication between the functional module and other functional modules or components associated with the electronic equipment enclosure. Finally, the front panel of the functional module typically includes one or more fasteners that engage corresponding structure of the card cage to aid in removable retention of the functional module within the card cage.

While functional modules such as those just described have proven useful in many regards, they nevertheless suffer from certain limitations. One area of particular concern relates to the electromagnetic emissions or radiation generated by circuitry of the functional modules during the normal course of operations. Such radiation often produces various undesirable effects. For example, unchecked electromagnetic emissions may interfere with, and significantly impair, the operation and integrity of unshielded equipment and systems in the vicinity of the electronic equipment enclosure wherein the radiating functional module is employed. Effects such as these are considered in terms of the degradation or impairment of the performance of a particular device, equipment, or system as a result of an electromagnetic disturbance, and are often referred to as electromagnetic interference, or "EMI."

Generally, EMI in a system/component occurs as a result of the generation and transmission of electromagnetic radiation by a radiation source such as a digital circuit of a functional module. EMI resulting from such emitted electromagnetic radiation can thus occur whenever a coupling path is established between a radiation source and unshielded systems/components in the vicinity of the radiation source. The coupling path can take a variety of forms. For example, the coupling path may comprise an electromagnetic or inductive coupling between the electromagnetic radiation source and the system/component where the EMI occurs In yet other cases, the coupling path may comprise an electrically conductive path between the electromagnetic radiation source and the impacted system/component. In this case, electromagnetic radiation generated by the electromagnetic radiation source is electrically conducted to the system/component at the other end of the coupling path. Frequently, transmission of electromagnetic radiation by this mode is a result of ungrounded, or poorly grounded, radiation emitting circuitry and/or related connectors.

As the foregoing makes clear, unchecked electromagnetic emissions from functional modules in an electronic equipment enclosure can materially impair the integrity and performance of systems and equipment that happen to form a coupling path with one or more of the functional modules. Moreover, even if no significant EMI ultimately results from the operation of a functional module or other component, many types of electronic equipment, including functional modules, are nonetheless required to comply with permissible EMI limits specified in standards mandated by governmental authorities and regulatory bodies such as the Federal Communications Commission ("FCC").

Because eliminating electromagnetic radiation emissions is impractical in many cases, at least one approach to resolving concerns such as those just described is to attempt to simply confine the emitted radiation in an effort to reduce the attendant EMI. Control of EMI in this way can be achieved to some extent by enclosing the system in a grounded conductive enclosure and by reducing the size of openings on the exterior of the enclosure so as to minimize the escape of electromagnetic radiation, such as would cause EMI, from the electronics contained within electronic equipment enclosure. Because the card cage defines a large opening in the enclosure, the front panels of the installed functional modules are required to complete the EMI containment of the enclosure.

A functional module completes the EMI containment by creating a low resistance conductive path between the front panel of the functional module and the front panels of adjacent functional modules and the surrounding enclosure. Unused card slots are typically filled with blank panels which incorporate the same EMI control features as a functional module and thus serve to complete the EMI containment of the enclosure.

For example, in many conventional electronic equipment enclosures and related systems and components, the short edges of the front panel of a functional module include conductive flanges which overlap the card cage mounting rails. This type of arrangement limits the flexibility of the card cage. In particular, the flanges of such functional modules are arranged to be connected to the rails of the card guide by an arrangement of screws and resilient elements that is intended to ensure good electrical contact between the functional module and the equipment enclosure. The vertical mounting configuration prevents horizontally adjacent card slots from being combined into a double wide or larger slot and, thus, the equipment enclosure is constrained for use solely with vertically stacked arrangements of horizontally oriented functional modules.

One consequence of this implementation of a functional module is that electrical communication between adjacent functional modules of this type, such as would aid in the containment of electromagnetic emissions, is only required to be implemented by conductive structures located on the top and bottom edges of the front panel of the functional module. To this end, some functional modules include electrically conductive "fingers" or other conductive elements, such as an EMI strip or gasket, that are configured and arranged to engage the conductive flange of the front panel of an adjacent functional module located above or below.

That is, functional modules of this type typically include a conductive flange along one long edge, and conductive fingers or similar conductive element along the other long edge, so that a conductive flange of one functional module contacts the conductive fingers of an adjacent functional module located above or below. Additional conductive fingers or gaskets may be employed to improve the electrical connection between the end flanges of the functional module front panel and the mounting rails. This arrangement of flanges and fingers is somewhat complex however and serves to complicate the manufacturing process. Moreover, this functional module configuration requires that the card cage include conductive fingers, either at the top or bottom of the opening, arranged to engage the flange of an installed functional module.

Thus, the configuration and arrangement of the card cage is largely dictated by the configuration of the functional modules to be used in that card cage and, in any event, is limited to use in connection with stacked arrangements of horizontally oriented functional modules, as discussed earlier. In particular, if a given functional module includes a conductive flange on the bottom edge, the corresponding electronic equipment enclosure must necessarily include conductive fingers, or similar structures, along the bottom that are able to interface with the flange of the functional module.

In general, the functionality of such conductive fingers or other conductive elements is sharply constrained by the fact that typical functional modules lack flexibility in terms of the configurations in which they may be arranged within the card cage of the electronic equipment enclosure.

In view of the foregoing, and other problems in the art not specifically enumerated herein, what is needed are electromagnetic radiation containment systems and devices that facilitate effective and reliable containment of electromagnetic radiation produced by one or more functional modules arranged horizontally and/or vertically in an electronic equipment enclosure. Further, such EMI containment devices and systems should be universal in the sense that the electronic equipment enclosure configuration is independent of the number and type of functional modules employed, and in the sense that physical nature of the contact between adjacent functional modules is substantially the same, regardless of the type, size, number or arrangement of such functional modules disposed in the electronic equipment enclosure.

BRIEF SUMMARY OF AN EXEMPLARY EMBODIMENT OF THE INVENTION

In general, embodiments of the invention are concerned with an electromagnetic radiation containment system, which may be collectively implemented by a combination of components, that includes features directed to containing electromagnetic radiation generated by functional modules disposed in an electronic equipment enclosure, so as to substantially eliminate EMI that would otherwise occur as the result of the generation of electromagnetic radiation by the functional modules. In one exemplary embodiment of the invention, a functional module is provided that is configured to be removably received by an electronic equipment enclosure. The functional module includes a card, or "blade," having circuitry suitable for implementing the functionality of the card. The card is configured to removably engage a card cage system of the electronic equipment enclosure. Various connectors on the card permit communication between the functional module and other functional modules or components associated with the electronic equipment enclosure. The card is attached to a front panel that comprises a variety of indicators, readouts, and input and output connectors configured and arranged for communication with the circuitry on the card. Further, the front panel of the functional module includes one or more fasteners which engage the card cage to aid in the secure retention of the functional module in the electronic equipment enclosure. The top, bottom, and side edges, collectively, the perimeter, of the front panel of the functional module each include a plurality of conductive elements that are configured and arranged for electrical communication with the chassis of the electronic equipment enclosure, as well as with one or more adjacent functional modules.

In some cases, it may be neither necessary nor desirable to completely occupy all of the slots in a card cage with functional modules. In such cases, a "blank" is provided that includes a front panel configured with fasteners which engage the card cage to aid in the secure retention of the blank in the electronic equipment enclosure. While the blank does not include a card, the perimeter of the front panel of the blank, like the front panel of the functional module includes, a plurality of conductive elements configured and arranged for electrical communication with the chassis of the electronic equipment enclosure, as well as with one or more adjacent blanks or functional modules.

The foregoing configuration is useful in a variety of operational scenarios. For example, even if only a single functional module is positioned in the electronic equipment enclosure, the electrical communication between the conductive elements of the functional module and the chassis of the electronic equipment enclosure serves to facilitate containment of electromagnetic radiation emissions, and the resultant EMI effects, that would likely otherwise result from operation of the functional module. A related aspect of the electrical communication implemented by the conductive elements is that such EMI effects are effectively controlled and/or reduced due, at least in part, to the fact that the conductive elements provide for effective and reliable connections between the front panels of the functional models and the surrounding enclosure which together define a complete grounded enclosure.

Further, the fact that such functional modules, and blanks, include the same type of conductive elements about their entire perimeters, means that one or more functional modules can be arranged in any fashion desired within the card cage and, thus, the arrangement of such functional modules is not dependent upon the configuration of the card cage nor upon the configuration or placement of any other functional module. Moreover, the fact that the functional modules and blanks each include the same type of conductive elements about their perimeters means that the nature of the contact between adjacent functional modules, and blanks, is the same in each case.

That is, such contact comprises contact between the conductive elements of one module or blank and the conductive elements of the adjacent module(s) or blank(s). In similar fashion, the nature of the contact between a functional module, or blank, and the chassis is likewise the same in each case. Specifically, the conductive elements of the functional module(s) or blank(s) contact the chassis. As discussed in further detail below, such uniformity in the construction of the modules, blanks, and chassis lends a high degree of flexibility to the use of the card cage and contributes significantly to electromagnetic radiation containment and EMI control.

As suggested by the foregoing, the electronic equipment enclosure includes multiple functional modules in some operational scenarios. In these types of arrangements, the conductive elements of each functional module communicate with each other and with the chassis so as to effectively ground the associated features of the functional modules. Consequently, when the electronic equipment enclosure is filled with functional modules and/or blanks, electromagnetic radiation generated by the functional modules is substantially contained within the electronic equipment enclosure, thereby providing for an attendant reduction in EMI and other harmful effects that may flow from the generation of electromagnetic radiation.

Thus, embodiments of the invention are effective in, among other things, substantially containing electromagnetic radiation generated by one or more functional modules, and thereby reducing or eliminating the EMI that would otherwise occur as the result of such radiation. Moreover, the uniformity of the construction of the functional modules, blanks, and chassis lend a high degree of flexibility to the use of the electronic equipment enclosure, without compromising the containment of electromagnetic radiation generated by the functional modules. These and other aspects of embodiments of the invention will become more fully apparent from the following description and appended claims.

BRIEF DESCRIPTION OF THE DRAWINGS

In order that the manner in which the above-recited and other aspects of the invention are obtained, a more particular description of the invention briefly described above will be rendered by reference to specific embodiments thereof which are illustrated in the appended drawings. Understanding that these drawings depict only exemplary embodiments of the invention and are not therefore to be considered limiting of its scope, the invention will be described and explained with additional specificity and detail through the use of the accompanying drawings in which.

DETAILED DESCRIPTION OF EXEMPLARY EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

Generally, embodiments of the invention concern an electromagnetic radiation containment system, which may be collectively implemented by a combination of components, that includes features directed to containing electromagnetic radiation generated by functional modules disposed in an electronic equipment enclosure, so as to substantially eliminate EMI that would otherwise occur as the result of the generation of electromagnetic radiation by the functional modules.

More particularly, exemplary embodiments of the invention include, among other things, functional modules and blanks having a plurality of conductive elements distributed about a substantial portion of the perimeter of the front panel so as to effectively and reliably implement electrical communication between the functional module and other functional modules, components or blanks associated with an electronic equipment enclosure. The electromagnetic radiation containment system also includes grounding elements, or other structures of comparable functionality, disposed on the chassis of the electronic equipment enclosure and arranged for contact with the conductive elements of the functional modules and blanks so as to facilitate substantial containment, within the electronic equipment enclosure, of electromagnetic radiation generated by the functional modules.

Figure 1:
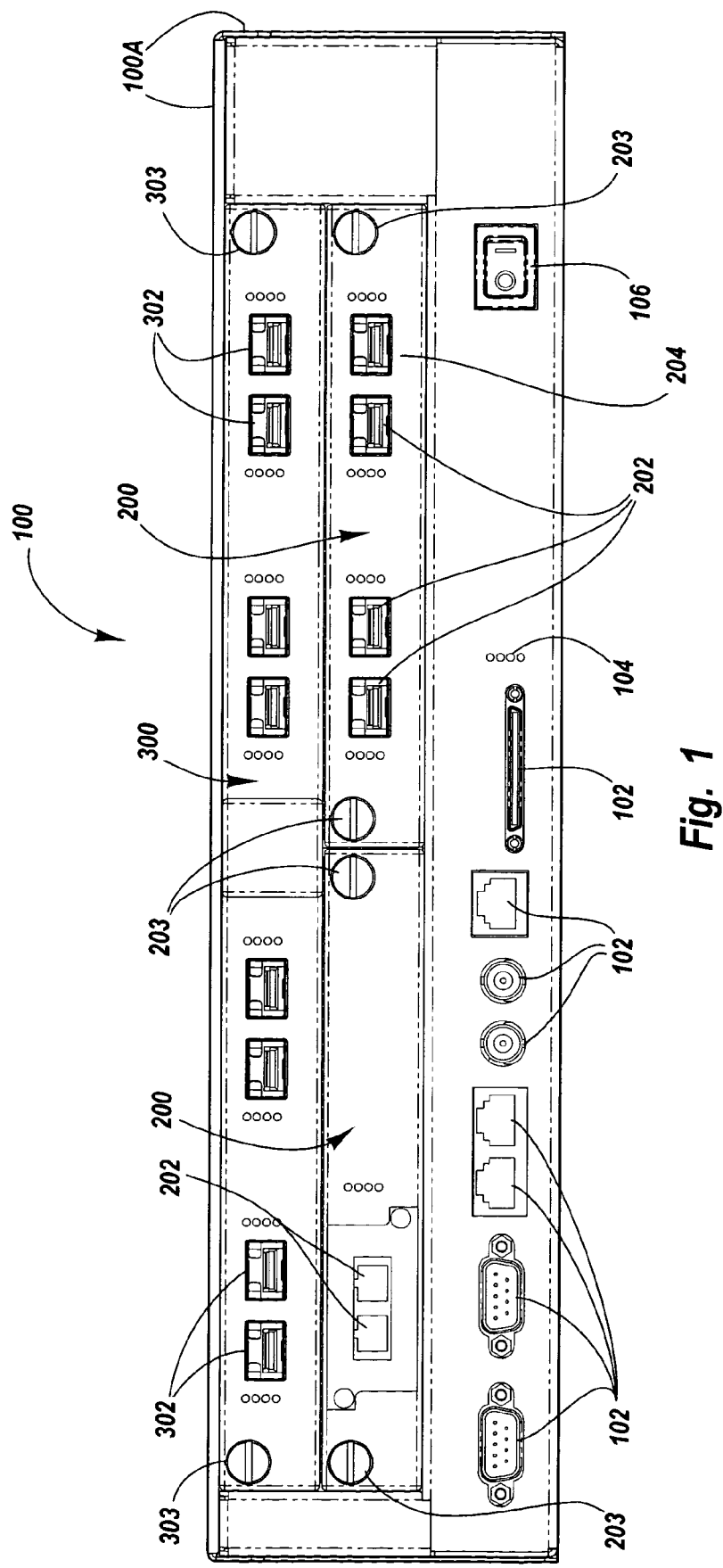
FIG. 1 is a front view illustrating aspects of the positioning of various functional modules within an electronic equipment enclosure.

Directing attention now to FIG. 1, an exemplary embodiment of an electronic equipment enclosure is designated at 100. Various configurations of the electronic equipment enclosure 100 may be employed. By way of example, electronic equipment enclosure 100 may have a nominal height of 2U, 3U or 6U, depending upon the requirements of a particular application, wherein each increment of 1 U corresponds to a distance of about one-and-three-quarters (1.75) inches. The foregoing dimensions are exemplary only however, and are not intended to limit the scope of the invention in any way.

Figure 2:
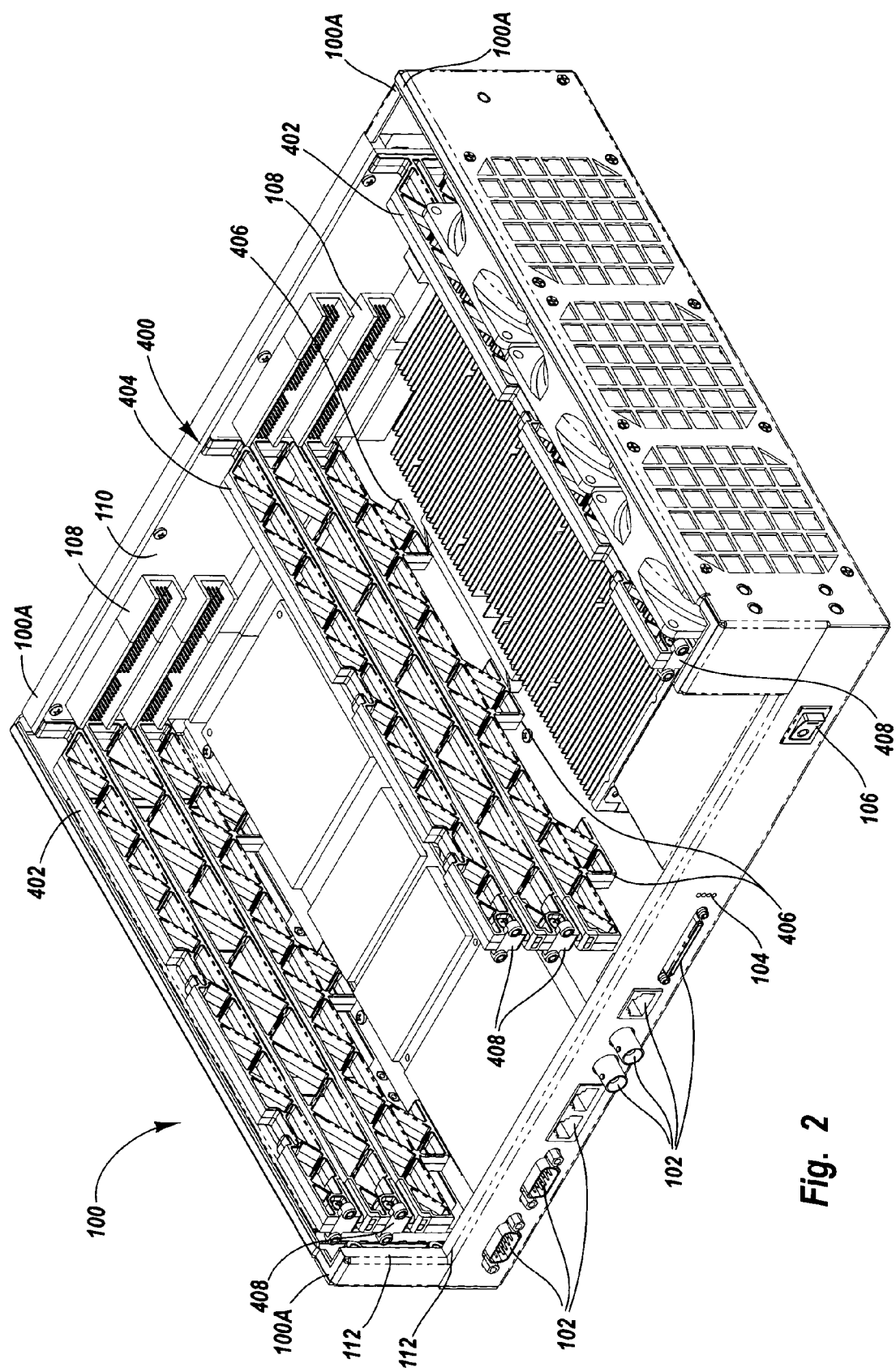
FIG. 2 is a front perspective view illustrating aspects of an exemplary electronic equipment enclosure (with cover and fictional modules removed) in conjunction with which embodiments of the invention may be usefully employed.

As indicated in FIG. 1, the illustrated electronic equipment enclosure 100 includes a chassis 100A, various front connectors 102, indicators 104, a power switch 106, and rear connectors 108 disposed on backplane 110 (see FIG. 2). Various additional or alternative components may likewise be employed. In general, the connectors 102 permit various external components and devices to communicate with one or more functional modules disposed in the electronic equipment enclosure 100.

In the exemplary illustrated embodiment, two single-wide functional modules 200 are positioned within the electronic equipment enclosure 100 in a side-by-side arrangement, and one double-wide functional module 300 is positioned in the electronic equipment enclosure 100 above the two single-wide functional modules 200. Of course, various other arrangements of functional modules and/or blanks may likewise be implemented, as discussed in further detail below. Accordingly, the arrangements disclosed herein are exemplary only and are not intended to limit the scope of the invention in any way.

With respect to the aforementioned blanks, such blanks generally comprise a front panel similar in size and configuration to that of a functional module, except that the front panel of the blank typically lacks connectors and indicators such as are illustrated in FIG. 1, for example. Similar to the functional module, the blanks include suitable fasteners for removably attaching the blank to the card cage contained within the chassis. In some implementations, the blank may also include a dummy card or blade sized, configured and arranged to mimic a PCB, but lacking circuitry.

As discussed in further detail below, the single-wide functional modules 200 and double-wide functional module 300 each include various corresponding connectors 202 and 302, and may include various other components and devices as well. Generally, single-wide functional modules 200 and double-wide functional module 300 are removably retained in position in the electronic equipment enclosure 100 by way of fasteners 203 and 303, respectively. Exemplary functionality for functional modules 200 and/or 300 includes, but is not limited to, various types of multi-channel applications.

It should be noted in connection with the foregoing that as used herein, "single-wide" and "double-wide" refer to functional modules that include an associated card having a nominal width that is some multiple of a predetermined dimension. The use of such notation herein should not, however, be construed in any way to limit the scope of the invention to cards and/or functional modules of particular dimensions or configurations.

As indicated earlier herein, various other arrangements of single-wide, double-wide, or other, functional modules may alternatively be employed. By way of example, an alternative arrangement includes four single-wide functional modules 200 stacked in a double height, side-by-side arrangement, but does not include any double-wide functional modules 300. In such a double height arrangement, the functional modules may, at the option of the user, be stacked on first and second card storage levels collectively defined by a card cage (see FIG. 2) of the electronic equipment enclosure 100. In other embodiments, triple height, or higher, arrangements may be employed. Yet another arrangement includes two double-wide functional modules 300 stacked one on top of the other, but does not include any single-wide functional modules 200. In yet another exemplary arrangement, one or more triple-wide, or larger, functional modules employed either alone or in combination with functional modules of other sizes or configurations.

In addition, embodiments of the electromagnetic radiation containment system may be implemented in connection with functional modules that are double height, or larger. That is, embodiments of the electromagnetic radiation containment system may be implemented in connection with functional modules that include two or more cards stacked in a vertical arrangement. Finally, embodiments of the invention may be employed in connection with card cages where the card slots are oriented horizontally or vertically. It thus should be clear that all references to horizontal and vertical are for reference only.

More generally then, aspects such as the size, arrangement, number, configuration and functionality of the functional modules 200 and 300 may be varied as necessary to suit the requirements of a particular application, and the scope of the invention should not be construed to be limited by the exemplary arrangements disclosed herein.

Directing attention now to FIG. 2, details are provided concerning further aspects of the electronic equipment enclosure 100 as employed in connection with an electromagnetic radiation containment system. The illustrated embodiment of the electronic equipment enclosure 100 includes a card cage system 400 generally configured to receive cards of one or more functional modules of various types and sizes in any of a variety of different arrangements.

In particular, the illustrated embodiment of card cage system 400 includes three double height card guides that cooperate to define first and second card storage levels. The card guides, designated end card guide 402 and middle card guide 404, are disposed in a spaced-apart configuration with respect to each other. Of course, variables such as, but not limited to, the number, height, width, length, spacing, and the number of card storage levels collectively defined by, end card guides 402 and middle card guide(s) 404, as well as the number of card guides, may be varied as necessary to suit the requirements of a particular application.

With general reference to their construction and arrangement, end card guides 402 and middle card guide 404 may comprise a web configuration, or other suitable construction, and include structure (not shown) for facilitating attachment of the card guide to the floor, lid, backplane 108, chassis 100A, and/or other structural elements of the electronic equipment enclosure 100. Some embodiments of end card guides 402 and/or middle card guide 404 additionally include one or more positioning members 406. Generally, positioning members 406 are constructed and arranged to aid in disposing the card guide at a desired location and orientation within electronic equipment enclosure 100.

The exemplary embodiment of the card cage system 400 further comprises a plurality of adapter elements 408 configured to be removably received in the card guides and to interface with a functional module by receiving the fasteners of the fictional module in bosses 408A defined in the adapter element. Selective use of the adapter elements 408 permit ready configuration of the card cage system 400 to received a desired number and arrangement of functional modules.

With continuing attention to FIG. 2, the illustrated embodiment of the electronic equipment enclosure 100 additionally includes one or more grounding elements 112 disposed at various appropriate locations on the chassis 100A. As suggested in FIG. 2, such grounding elements 112 are configured and arranged so that regardless of the size or position of a functional module in the electronic equipment enclosure 100, at least one side of the functional module will be arranged for contact with at least one grounding element. This is true even if as few as a single functional module is present in the electronic equipment enclosure 100. The grounding elements may be implemented as exposed conductive surfaces of the chassis or as separately installed components. As discussed in further detail below, this configuration facilitates improved electromagnetic radiation containment within the electronic equipment enclosure 100 and, accordingly, enhanced EMI reduction and/or control, because such arrangement provides for, among other things, effective and reliable grounding of the installed functional module(s) 100. The illustrated implementation of grounding elements 112 is exemplary only however, and any other structures or elements, or combinations thereof, of comparable functionality may likewise be employed.

Figure 3:
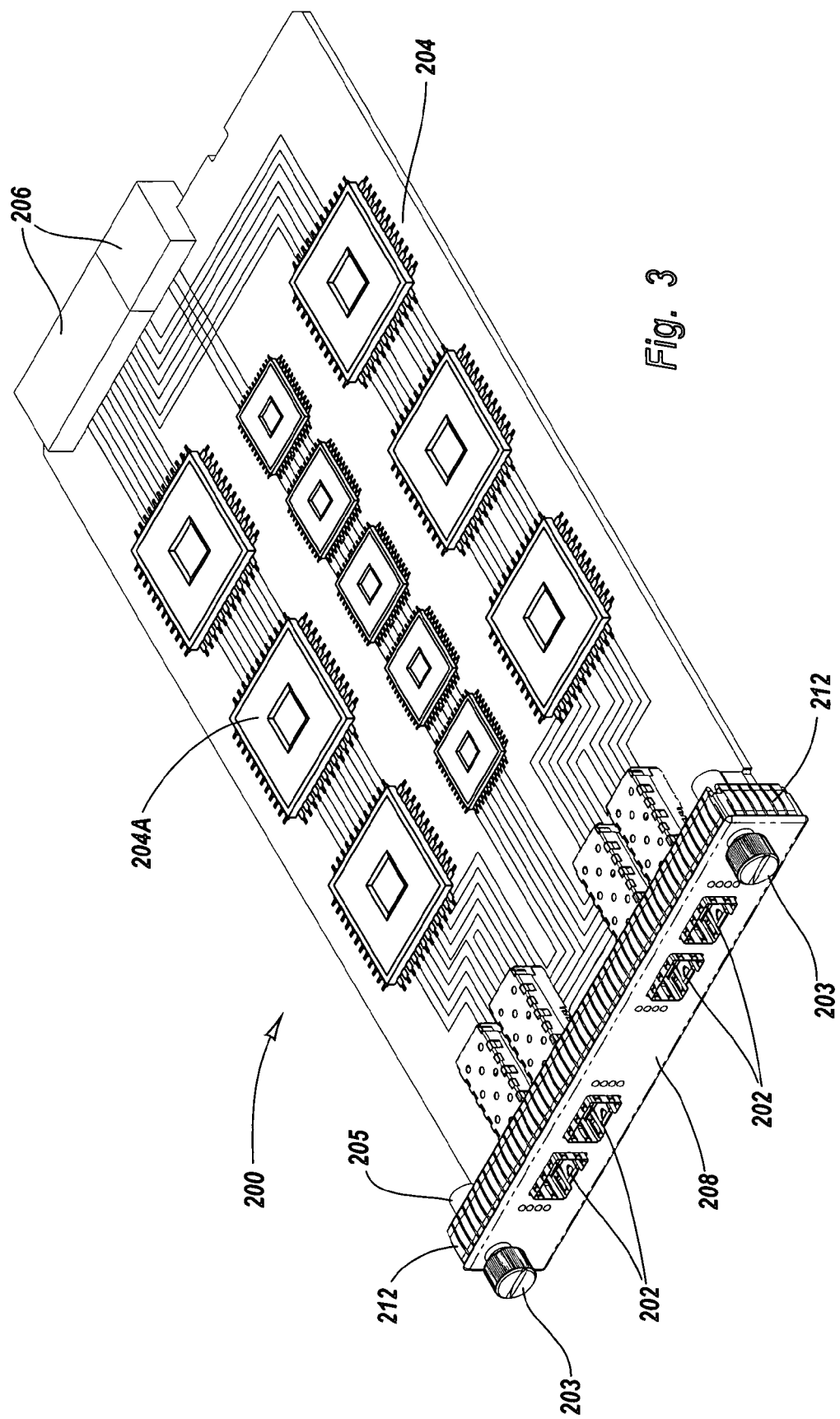
FIG. 3 is a front perspective view illustrating various aspects of an exemplary embodiment of a single-wide functional module.

Directing attention now to FIG. 3, various aspects of an exemplary embodiment of single-wide functional module 200, such as may be usefully employed in conjunction with the electronic equipment enclosure 100 in facilitating electromagnetic radiation containment, are considered. Generally, single-wide functional module 200 includes a single-wide card 204, which comprises a printed circuit board ("PCB") in at least some embodiments. Disposed on single-wide card 204 are various electronic circuitry and devices (not shown) which are effective to implement the particular functionality, or functionalities, associated with single-wide functional module 200. Such electronic circuitry and devices communicate electrically with various components, functional modules and devices within, and/or without, electronic equipment enclosure 100.

In at least some embodiments, such electrical communication is achieved, at least in part, through the use of connectors 206 that are electrically connected with the circuitry and devices of single-wide card 204 and are configured and positioned to mechanically and electrically interface with corresponding connectors 108 disposed on the backplane 110 (see FIG. 2) of electronic equipment enclosure 100.

The single-wide card 204, in turn, is attached to a front panel 208 that includes one or more fasteners 203 that pass through a lead-in structure 205 and permit single-wide functional module 200 to be removably attached to card cage system 400 of electronic equipment enclosure 100. Generally, the lead-in structures 205 and 305 (FIG. 4) are configured and arranged to engage corresponding structure (see boss 408A in FIG. 5A) of an adapter element 408. The lead-in structures facilitate ready and reliable positioning of the fasteners relative to the adapter element when it is desired to install a functional module in the card cage.

In the exemplary embodiment illustrated in FIG. 3 (see also FIGS. 5A and 5B), fasteners 203 generally comprise thumb screws that extend through front panel 208 and that include a nose portion having a taper that is complementary with a countersink of a tapped hole defined in an adapter element, discussed below. Of course, any other fastener or device having the functionality disclosed herein may alternatively be employed. Further details concerning aspects of an exemplary embodiment of fastener 203 are provided below in connection with the discussion of FIGS. 5A and 5B.

As noted earlier, single-wide functional module 200 additionally includes various electronic devices, such as connectors 202, that are accessible by way of front panel 208. Generally, such connectors 202 are electrically and mechanically configured to facilitate electrical communication between one or more external devices (not shown) and the circuitry (not shown) disposed on single-wide card 204 and/or the circuitry and electronic devices in communication with single-wide card 204 by way of connectors 206. Additional or alternative electrical devices and components may likewise be employed in conjunction with single-wide functional module 200. By way of example, some exemplary embodiments of single-wide functional module 200 include one or more readouts, indicators and feedback devices.

With continuing attention to FIG. 3, single-wide functional module 200 further includes a plurality of conductive elements 212 disposed about the perimeter, or top and bottom edges, and side edges, of front panel 208 and electrically connected with each other and the front panel. Exemplary embodiments of the conductive elements 212 comprise any suitable electrically conductive material, examples of which include, but are not limited to, copper, copper alloys, steel, and conductive elastomer.

Moreover, variables such as, but not limited to, the size, configuration, geometry, arrangement, and spacing of the conductive elements 212 may be varied as desired. As an example, in at least some embodiments, the conductive elements 212 are sized so that some of the conductive elements 212 are relatively wider than others. As suggested in FIG. 3 for example, the conductive elements 212 may be substantially uniform in terms of their configuration.

Figure 4:
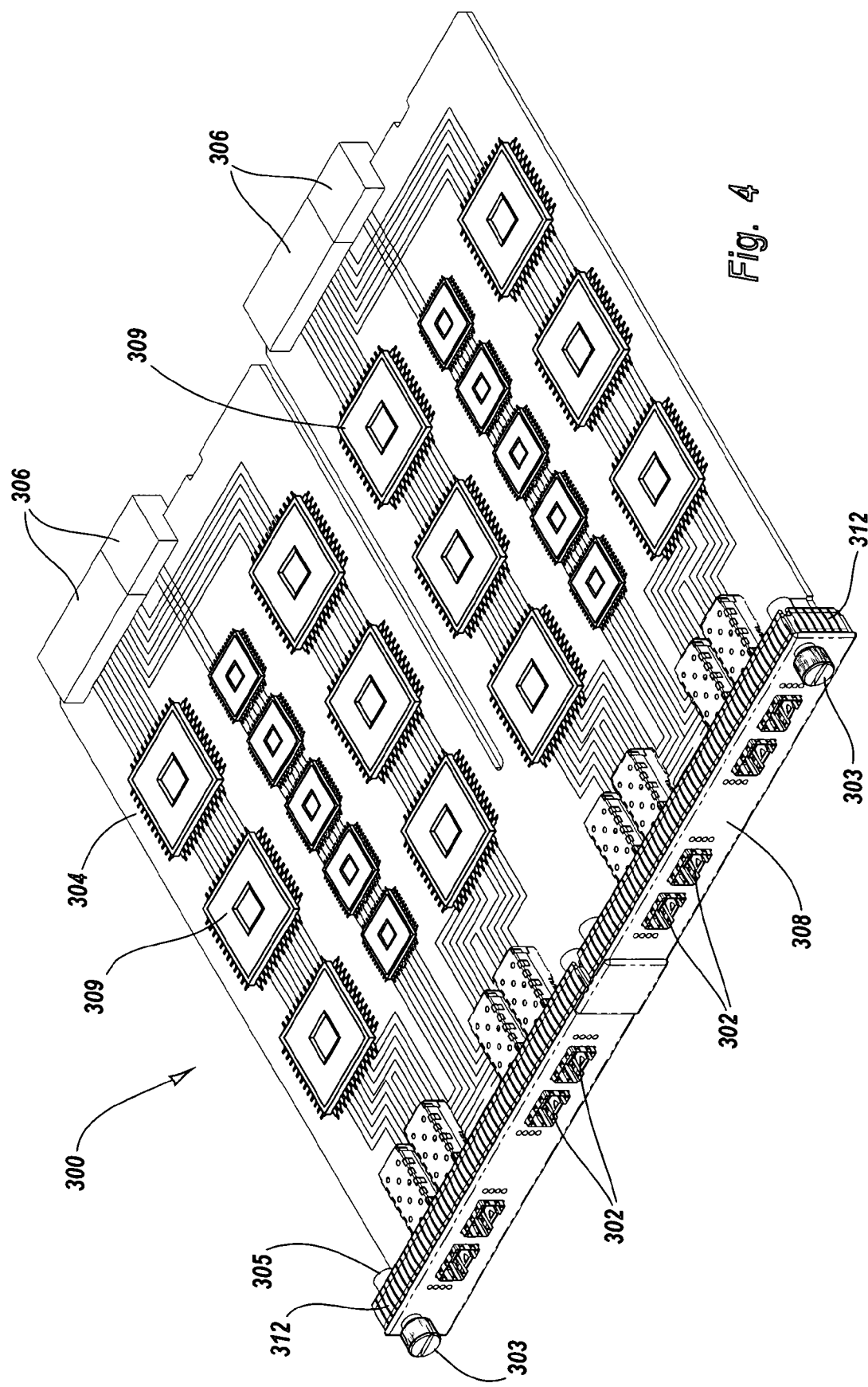
FIG. 4 is a front perspective view illustrating various aspects of an exemplary embodiment of a double-wide functional module.

In other implementations however, the conductive elements 212 of a particular functional module, or blank, may be implemented in two or more different configurations. For example, some implementations of the functional module may be configured so that only a single conductive element 212 is provided on the short edges of the front panel of the functional module, while multiple conductive elements 212 are provided along the two long edges of the front panel of the functional module. The foregoing is likewise germane to conductive elements 312 (FIG. 4). Thus, the scope of the invention should not be construed to be limited to any particular arrangement or configuration of conductive elements.

As discussed in further detail below, the conductive elements 212 generally facilitate electrical communication between the electronic circuitry of single-wide functional module 200 and the grounding elements 112 of chassis 100A, and/or electrical communication between the electronic circuitry 204A of single-wide functional module 200 and the electronic circuitry of one or more adjacent functional modules, thereby aiding in the containment of electromagnetic radiation generated within the electronic equipment enclosure 100. Note that as contemplated herein, an 'adjacent' functional module refers to any functional module(s) located immediately above or below a specified functional module, as well as functional modules located immediately to either side of a specified functional module.

Directing attention now to FIG. 4, details are provided concerning various aspects of the double-wide functional module 300 such as may usefully be employed in conjunction with the electronic equipment enclosure 100 in the containment and control of electromagnetic radiation and associated effects. As many aspects of the doublewide functional module 300 are similar to those discussed above in relation to the single-wide functional module 200, the following discussion will focus primarily on selected differences between the two exemplary functional module configurations.

Generally, double-wide functional module 300 includes a double-wide card 204, which comprises a printed circuit board ("PCB") in at least some embodiments. Disposed on double-wide card 304 are various electronic circuitry and devices 309 which are effective to implement the particular functionality, or functionalities, associated with double-wide functional module 300. Such electronic circuitry and devices communicate electrically with various components, functional modules and devices within, and/or without, electronic equipment enclosure 100.

In at least some embodiments, such electrical communication is achieved, at least in part, through the use of connectors 306 that are electrically connected with the circuitry and devices of double-wide card 304 and are configured and positioned to mechanically and electrically interface with corresponding connectors 108 disposed on the backplane 110 (see FIG. 2) of electronic equipment enclosure 100.

Figure 5A:
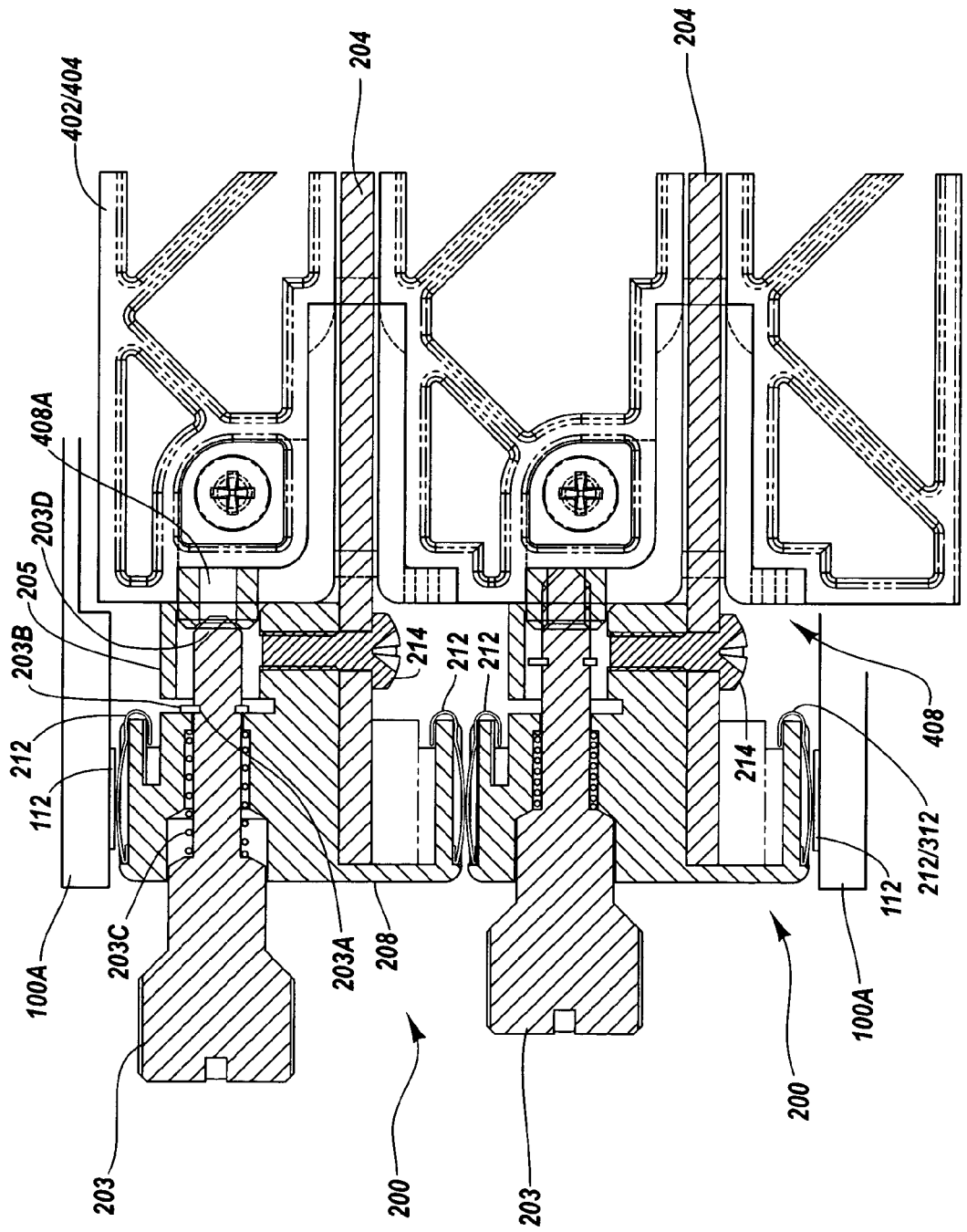
FIG. 5A is a section view illustrating aspects of the installation of an exemplary embodiment of two single-wide functional modules in a vertically stacked arrangement in an electronic equipment enclosure.
Figure 5B:
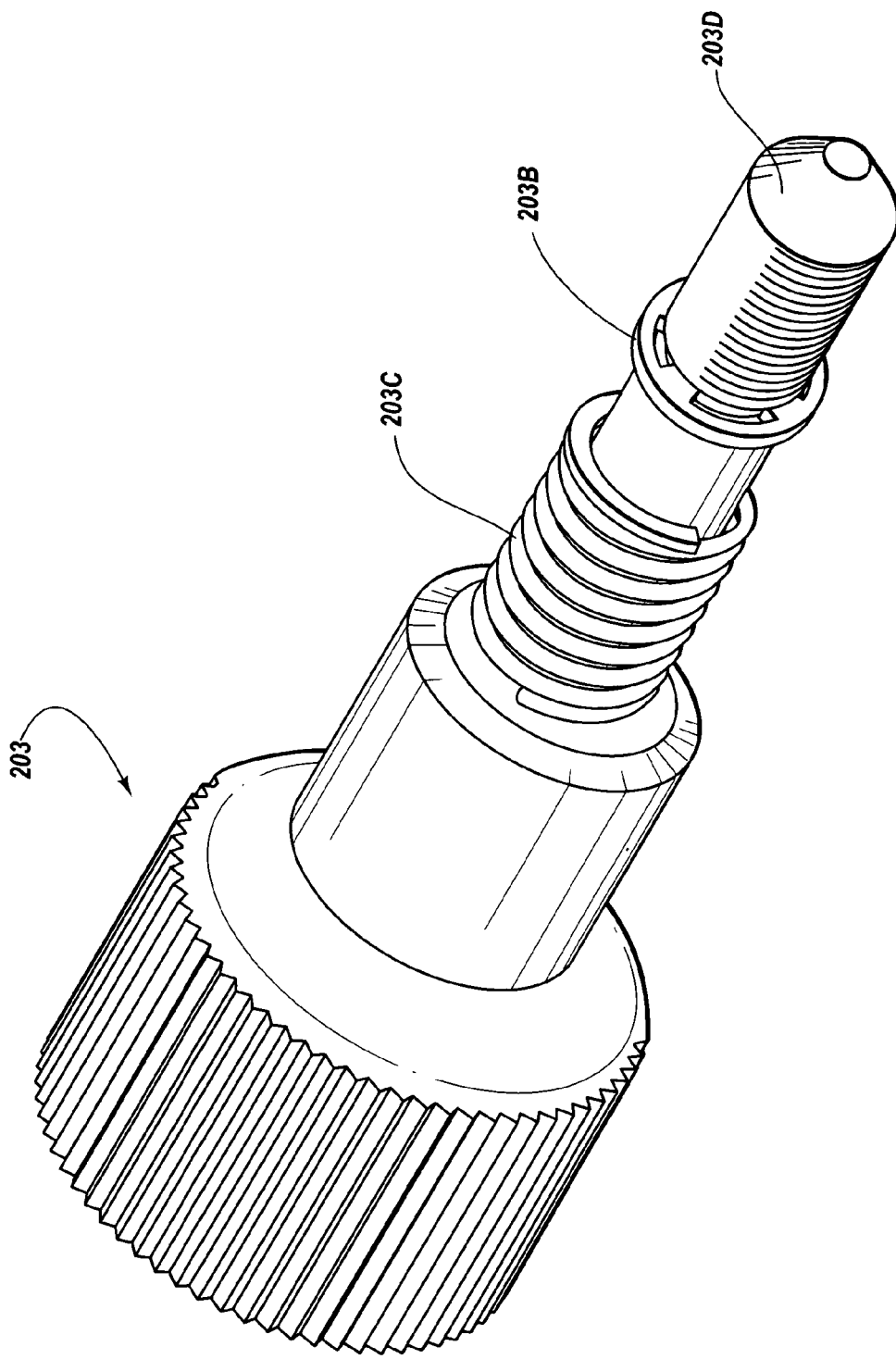
FIG. 5B is a perspective view of an exemplary embodiment of a fastener suited for use in the retention of a functional module in the card cage.

The double-wide card 304, in turn, is attached to a front panel 308 that includes one or more fasteners 303 that permit double-wide functional module 300 to be removably attached to card cage system 400 of electronic equipment enclosure 100. In a the exemplary embodiment illustrated in FIG. 4, fasteners 303 comprise thumb screws that extend through front panel 308 and that include a nose portion having a taper that is complementary with a countersink of a tapped hole defined in an adapter element, discussed below. Of course, any other fastener or device having the functionality disclosed herein may alternatively be employed. Further details of an exemplary fastener are illustrated in FIGS. 5A and 5B, discussed below.

In addition to the aforementioned features, at least some embodiments of card 304 define a slot 304A that is configured and arranged to interface with the card cage system 400 so that the double-wide functional module 300 can be readily positioned within the electronic equipment enclosure 100.

As noted earlier, double-wide functional module 300 additionally includes various electronic devices, such as connectors 302, that are accessible by way of front panel 308. Generally, such connectors 302 are electrically and mechanically configured to facilitate electrical communication between one or more external devices (not shown) and the circuitry (not shown) disposed on double-wide card 304 and/or the circuitry and electronic devices in communication with double-wide card 304 by way of connectors 306. Additional or alternative electrical devices and components may likewise be employed in double-wide functional module 300. By way of example, some exemplary embodiments of double-wide functional module 300 include one or more readouts, indicators and feedback devices.

With continuing attention to FIG. 4, double-wide functional module 300 further includes a plurality of conductive elements 312 disposed about the perimeter, or top and bottom edges, and side edges, of front panel 308. As in the case of conductive elements 212, exemplary embodiments of the conductive elements 312 comprise any suitable electrically conductive material, examples of which include, but are not limited to, copper, copper alloys, steel, and conductive elastomer. Moreover, variables such as, but not limited to, the size, configuration, geometry, arrangement, and spacing of the conductive elements 312 may be varied as desired. In general, the functionality implemented by conductive elements 312 is similar to that provided by conductive elements 212, as discussed below.

Figure 5C:
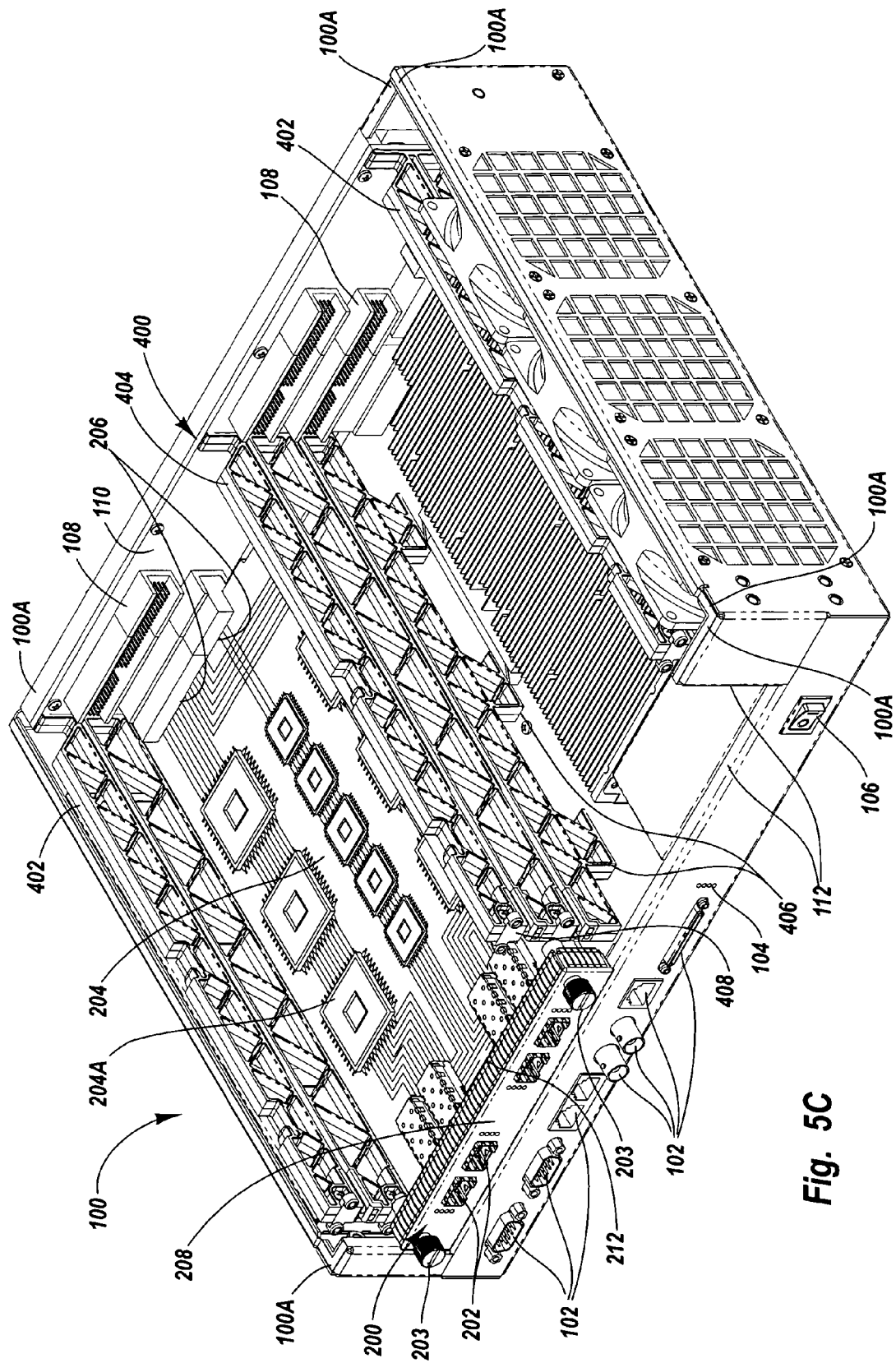
FIG. 5C is a front perspective cutaway view illustrating aspects of the installation of an exemplary embodiment of a single-wide functional module in an electronic equipment enclosure.

Directing attention now to FIGS. 5A through 5C, details are provided concerning the positioning of a single-wide functional module 200 in an exemplary card cage system 400. While the following discussion of FIGS. 5A through 5C is directed to the single-wide functional module 200, it is generally germane to double-wide, and larger, functional modules as well.

With particular reference first to FIG. 5A, the card 204, joined to front panel 208 by one or more fasteners 203 that pass through corresponding openings defined by card 204, is received, in this exemplary arrangement, by the adapter element 408 and one or more of the card guides 402/404. Once fully inserted into the card cage system 400, the single-wide functional module 200 is securely retained in position by the engagement of fasteners 203 with adapter element 408. As indicated in FIGS. 5A and 5B, fastener 203 defines a circumferential slot 203A configured to receive an e-clip 203B. In general, e-clip 203B prevents fastener 203 from being fully withdrawn from single-wide functional module 200.

As further indicated in FIGS. 5A and 5B, a spring 203C is provided that serves to urge fastener 203 away from boss 408A when the fastener 203 is disengaged therefrom. Finally, a tapered nose portion 203D of fastener 203 aids in the initial alignment of fastener 203 with hole 408A which exemplarily includes a complementary countersink wherein tapered nose portion 203D is initially received. The tapered nose portion 203D also precludes binding of fastener 203 as it is brought into engagement with hole 408A. Note that while the preceding discussion has primarily been directed to fastener 203, such discussion is equally germane to fasteners of other functional modules as well.

Thus, one aspect of the exemplary fastener 203 arrangements illustrated in FIG. 5A, and in FIG. 1, is that the fasteners 203 are positioned so as to not interfere in any way with the positioning or placement of adjacent functional modules. This arrangement of the fasteners 203 thereby facilitates stacking of the functional modules one above another, and/or side-by-side, and also permits the conductive elements 212 and 312, as applicable, to be positioned where the flanges of conventional functional modules are typically located. This arrangement further permits substantial contact between conductive elements of adjacent functional modules in the electronic equipment enclosure.

Directing attention now to FIG. 5C, and with continuing attention to FIG. 5A, further details are provided concerning aspects of the positioning of the single-wide functional module 200 in the electronic equipment enclosure 100. As suggested in FIG. 5C, some aspects of such positioning concern conductive elements 212 of the single-wide functional module 200.

For example, the conductive elements 212 may, in at least some embodiments, be of a resilient nature. Thus, when the single-wide functional module 200 is positioned in the card cage system 400, either alone, or adjacent to another functional module, or blank, as indicated in FIGS. 5A and 5C, the conductive elements that contact the grounding elements 112 and/or the conductive elements of an adjacent functional module, experience a slight elastic deformation.

Among other things, the resilient nature of the conductive elements 212 contributes to improved physical contact with the grounding elements 112 and/or the conductive elements of an adjacent functional module, and thus, better grounding of the connected circuitry of the functional module(s). By implementing this functionality, conductive elements 212 aid in the containment of electromagnetic radiation emitted from within the electronic equipment enclosure 100 by functional module 200 and/or other functional modules that may be positioned in the electronic equipment enclosure 100. In this way, the conductive elements 212 facilitate the containment of electromagnetic radiation generated by functional modules disposed in the electronic equipment enclosure 100.

Figure 6:
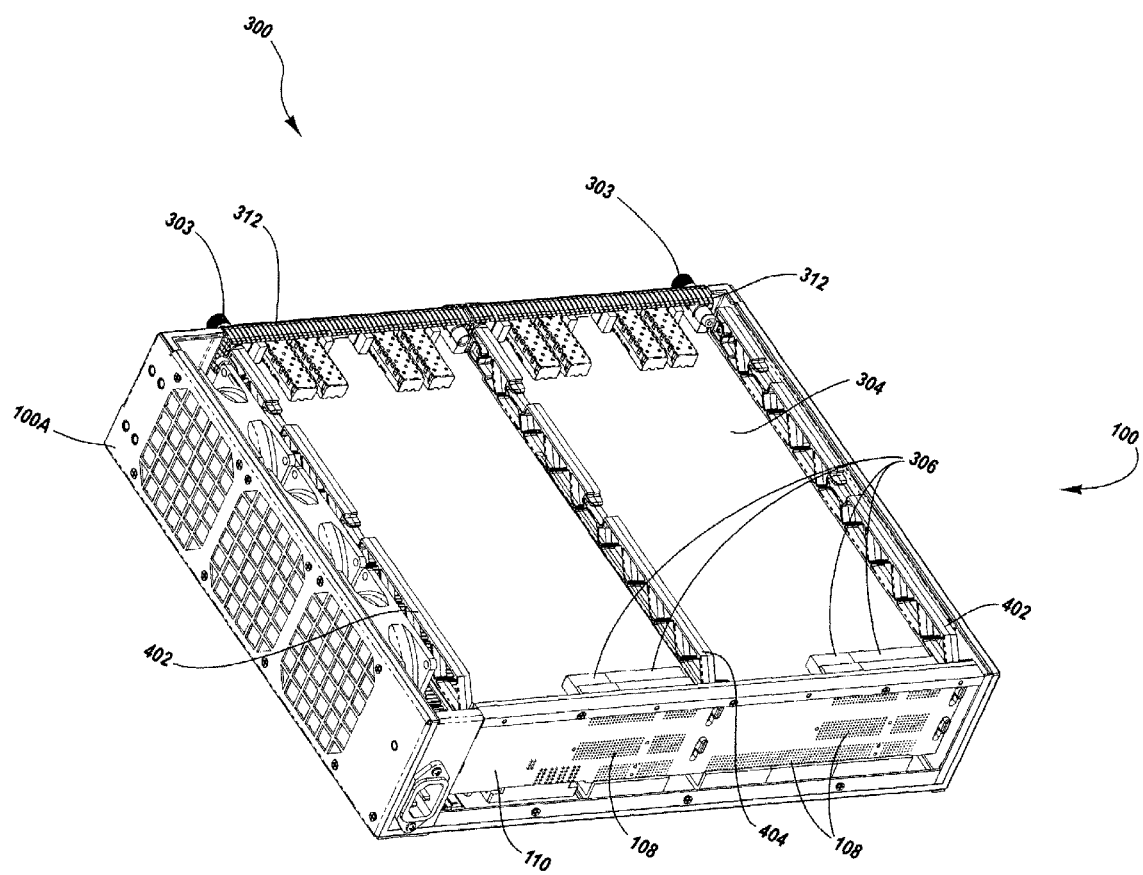
FIG. 6 is a rear perspective cutaway view illustrating aspects of the installation of an exemplary embodiment of a double-wide functional module in an electronic equipment enclosure.

Further, as suggested by the exemplary arrangement of conductive elements illustrated in FIGS. 5A and 5C, and FIG. 6, the aforementioned functionality can be implemented in any of a variety of functional module arrangements. In particular, the illustrated exemplary arrangements of conductive elements 212 and 312 permits functional modules received in the electronic equipment enclosure 100 to electrically communicate with any and all adjacent functional modules, without regard to whether the functional modules are arranged side-by-side or one above the other, or both.

Moreover, the arrangement of the conductive elements 212 and 312 enables electrical communication between the functional module and the chassis 100A thereby further advancing the containment of electromagnetic radiation and, thus, control of associated EMI. Thus, the arrangement of the conductive elements 212 and 312 facilitates implementation of EMI reduction and/or control in any configuration or Arrangement of functional modules and/or blanks that a user may select with respect to the electronic equipment enclosure 100.

Further, because the conductive elements 212 and 312 are, in some embodiments, in electrical communication with external conductive surfaces of the functional modules, such as front panels 208 and 308, respectively, such conductive elements provide a grounding functionality with respect to such external conductive surfaces and thereby provide a further measure of reduction and/or control with respect to EMI and related problems.

As disclosed herein then, the electromagnetic radiation containment system, exemplary embodiments of which comprise sets of conductive elements or comparable structures disposed on the functional modules, as well as grounding strips or comparable structures positioned on the chassis of the electronic equipment enclosure 100, enables substantial containment of electromagnetic radiation within the electronic equipment enclosure 100 when all of the card slots of the electronic equipment enclosure 100 are occupied either by a functional module or a blank. Moreover, the uniformity of the construction and configuration of the functional modules, blanks, and chassis lend a high degree of flexibility to the use of the electronic equipment enclosure, in terms of the types, configurations and arrangements of such functional modules and blanks that may be employed, without materially compromising the effectiveness or reliability with which electromagnetic radiation is contained or confined within the electronic equipment enclosure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A functional module for use in conjunction with an electronic equipment enclosure that includes a card cage disposed in a chassis that includes at least one grounding element, the functional module comprising:

a front panel;

a card attached to the front panel and configured to be removably received in the card cage;

electronic circuitry disposed on the card; and a plurality of resilient conductive elements disposed substantially about an entire perimeter of the front panel and electrically connected with at least some of the electronic circuitry, each of the plurality of resilient conductive elements being arranged for contact with either a grounding element or adjacent functional module or blank when the functional module is positioned within the card cage, wherein at least two of the resilient conductive elements have different widths, and wherein the card extends from two sides of the functional module so as to be received by opposing card guides.

2. The functional module as recited in claim 1, wherein the functional module is configured to be received in the electronic equipment enclosure along with an adjacent functional module.

3. The functional module as recited in claim 2, wherein the adjacent functional module is located alongside the functional module.

4. The functional module as recited in claim 2, wherein the adjacent functional module is located either above or below the functional module.

5. The functional module as recited in claim 1, wherein the resilient conductive elements are in electrical communication with each other.

6. The functional module as recited in claim 1, wherein the card comprises a single-wide card.

7. The functional module as recited in claim 1, wherein the card comprises a card that is at least double-width.

8. The functional module as recited in claim 1, further comprising at least two fasteners passing through the front panel and configured to removably engage the card cage, the at least two fasteners being located so as to allow another functional module to be positioned in the card cage alongside the functional module.

9. The functional module as recited in claim 1, further comprising at least one connector accessible by way of the front panel and connected with the electronic circuitry.

10. The functional module as recited in claim 1, further comprising at least one connector disposed proximate a back edge of the card and electrically connected with the electronic circuitry.

11. The functional module as recited in claim 1, wherein when the card cage is fully occupied, a first group of resilient conductive elements of the functional module contacts only conductive elements of another functional module or blank, while a second group of resilient conductive elements of the functional module contacts only the grounding element.

12. The functional module as recited in claim 1, wherein a substantial portion of the resilient conductive elements of the functional module have substantially the same size and geometry.

13. The functional module as recited in claim 1, wherein one or more of the resilient conductive elements substantially comprises one of copper; copper alloy; steel; and, conductive elastomer.

14. The functional module as recited in claim 1, wherein when the functional module is positioned in the card cage adjacent to a second functional module or blank, physical contact occurs between resilient conductive elements of the functional module and conductive elements of the second functional module or blank.

15. The functional module as recited in claim 1, wherein the resilient conductive elements are configured to deform when in contact with conductive elements of an adjacent blank or functional module.

16. An electronics system, comprising:
   an enclosure; and
   at least one functional module configured according to claim 1 and received in the enclosure.

17. The electronics system as recited in claim 16, wherein a first functional module of the at least one functional module comprises a single-wide functional module, and a second functional module of the at least one functional module comprises a functional module that is at least double-wide.

18. The electronics system as recited in claim 17, wherein the second functional module is configured to be positioned alongside of the first functional module when the second functional module and the first functional module both reside in the enclosure.

19. The electronics system as recited in claim 17, wherein the second functional module is configured to be positioned either above or below the first functional module when the second functional module and the first functional module both reside in the enclosure.

20. The functional module as recited in claim 1, wherein a first set of opposing sides of the front panel each include a single conductive element and a second set of opposing sides of the front panel each include multiple conductive elements.

21. The functional module as recited in claim 1, wherein the conductive elements vary as to spacing.

22. The functional module as recited in claim 1, wherein a first set of opposing sides of the front panel each include at least five conductive elements and a second set of opposing sides of the front panel each include at least four times as many conductive elements as the first set of opposing sides of the front panel.

* * * * *

UNITED STATES PATENT AND TRADEMARK OFFICE
CERTIFICATE OF CORRECTION

| | | |
|---|---|---|
| PATENT NO. | : 7,457,134 B2 | Page 1 of 1 |
| APPLICATION NO. | : 10/639211 | |
| DATED | : November 25, 2008 | |
| INVENTOR(S) | : Donald A. Ice | |

It is certified that error appears in the above-identified patent and that said Letters Patent is hereby corrected as shown below:

Column 13
Line 24, change "Arrangement" to --arrangement--

Signed and Sealed this

Twentieth Day of July, 2010

David J. Kappos
*Director of the United States Patent and Trademark Office*

UNITED STATES PATENT AND TRADEMARK OFFICE
CERTIFICATE OF CORRECTION

PATENT NO.          : 7,457,134 B2
APPLICATION NO.     : 10/639211
DATED               : November 25, 2008
INVENTOR(S)         : Donald A. Ice It is certified that error appears in the above-identified patent and that said Letters Patent is hereby corrected as shown below:

Column 2
Line 46, add --.-- after "occurs"

Column 4
Line 66, change "module includes," to --module, includes--

Column 5
Line 62, change "lend" to --lends--

Column 8
Line 2, change "other," to --other--
Line 21, change "double height," to --double-height,--
Line 51, change "by," to --by--

Column 9
Line 5, add --(FIG. 5A)-- after "408A"
Line 27, change "100." to --200 and 300.--
Line 40, change "(not shown)" to --204A--
Line 67, remove [that] before "include"

Column 10
Line 14, change "(not shown)" to --204A--

Column 11
Line 3, change "doublewide" to --double-wide--
Line 9, change "204" to --304--
Line 29, change "100. In a the" to --100. In the--
Line 39, change "slot 304A that" to --slot that--
Line 49, change "(not shown)" to --309--

This certificate supersedes the Certificate of Correction issued July 20, 2010.

Signed and Sealed this

Fifth Day of October, 2010

David J. Kappos
*Director of the United States Patent and Trademark Office*

Column 13
Line 24, change "Arrangement" to --arrangement--